(12) United States Patent
Wang et al.

(10) Patent No.: US 8,659,489 B2
(45) Date of Patent: Feb. 25, 2014

(54) RADIO FREQUENCY PRINTED CIRCUIT BOARD

(75) Inventors: Jun-Wei Wang, Shenzhen (CN); Chun-Chieh Tsen, Tu-Cheng (TW)

(73) Assignees: Hong Fu Jin Precision Industry (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 396 days.

(21) Appl. No.: 13/157,322

(22) Filed: Jun. 10, 2011

(65) Prior Publication Data

US 2012/0249381 A1    Oct. 4, 2012

(30) Foreign Application Priority Data

Mar. 28, 2011 (CN) .......................... 2011 1 0075158

(51) Int. Cl.
*G01R 29/10* (2006.01)
(52) U.S. Cl.
USPC ......................................................... 343/703
(58) Field of Classification Search
USPC ...................................... 343/703; 324/754.23
See application file for complete search history.

(56) References Cited

U.S. PATENT DOCUMENTS

| | | | | |
|---|---|---|---|---|
| 6,380,752 | B1 * | 4/2002 | Irino | 324/750.26 |
| 6,456,070 | B1 * | 9/2002 | Kazama et al. | 324/260 |
| 6,696,834 | B2 * | 2/2004 | Kou et al. | 324/258 |
| 7,642,973 | B2 * | 1/2010 | Maekawa et al. | 343/703 |

FOREIGN PATENT DOCUMENTS

| | | |
|---|---|---|
| TW | M358968 | 6/2009 |
| TW | 201104262 | 2/2011 |

* cited by examiner

*Primary Examiner* — Seung Lee
(74) *Attorney, Agent, or Firm* — Altis Law Group, Inc.

(57) ABSTRACT

A radio frequency(RF) printed circuit board (PCB) includes an RF circuit for generating high frequency signals. The RF PCB is connected to an EMC measuring device when measuring the EMC thereof. The measuring device includes a probe pin and a shielding barrel surrounding the probe pin. The shielding barrel includes an end surface at a distal end thereof. The RF PCB further includes a test node connected to the RF circuit and a ground node surrounding the test node. The test node contacts the probe pin and outputs the high frequency signals when measuring the EMC of the RF PCB. The ground node corresponds to the end surface and contacts the end surface while the probe pin contacts the test node.

7 Claims, 4 Drawing Sheets

RADIO FREQUENCY PRINTED CIRCUIT BOARD

BACKGROUND

1. Technical Field

The present disclosure relates to printed circuit boards (PCBs) and, particularly, to a radio frequency (RF) PCB.

2. Description of Related Art

RF products usually include a PCB and an antenna. The PCB includes an RF circuit, which generates high frequency signals, and a connection node connecting to the antenna. Thus, the high frequency signals can be emitted by the antenna. The RF products need to pass an electromagnetic compatibility (EMC) test, where the EMC is measured using a direct measurement method. In the direct measurement method, the antenna is removed and an EMC measuring device is connected to the connection node. In particular, the EMC measuring device includes a probe. The probe includes a probe pin and a shielding barrel surrounding the probe pin. The probe pin contacts the connection node, while the shielding barrel connects to the ground of the PCB. The shielding barrel cooperates with the PCB to enclose the probe pin to provide EMC shield for the probe pin. However, current PCBs do not have a ground node around the connection node to allow the shielding barrel to be directly connected. Thus, the shielding barrel needs to be grounded with extra wires, which is inconvenient.

Therefore, it is desirable to provide a radio frequency PCB to overcome the above mentioned limitations.

BRIEF DESCRIPTION OF THE DRAWINGS

Many aspects of the present disclosure should be better understood with reference to the following drawings.

DETAILED DESCRIPTION

Embodiments of the present disclosure will now be described in detail with reference to the drawings.

Figure 1:
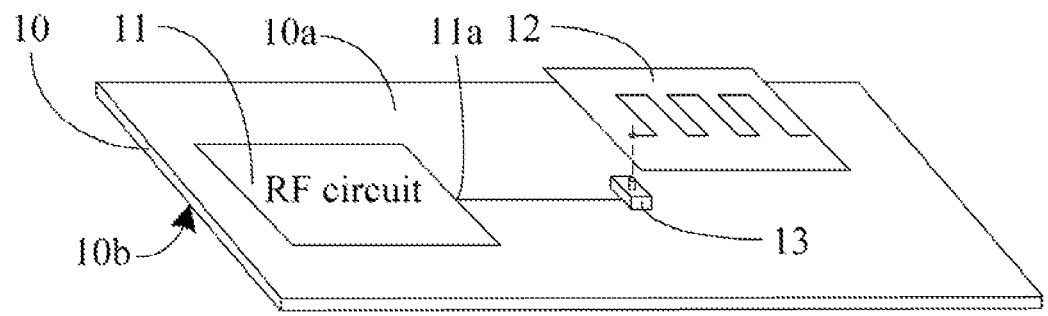
FIG. 1 is a schematic view of an RF PCB, in accordance with an embodiment.
Figure 2:
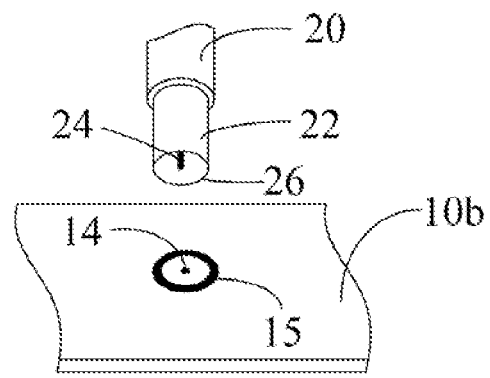
FIG. 2 is a partial view of a probe of an EMC measuring device and the RF PCB of FIG. 1, which is viewed at another angle.

Referring to FIGS. 1 and 2, an RF PCB 10, according to an embodiment, is shown. The RF PCB 10 is connected to a probe 20 of an EMC measuring device (not shown) when EMC of the RF PCB 10 needs to be measured. The EMC measuring device includes a probe 20 that is configured to connect to the RF PCB 10. The probe 20 includes a probe pin 24 and a shielding barrel 22 surrounding the probe pin 24. The shielding barrel 22 is tubular with one end opened, and thus includes an annular end surface 26 at the open end. The probe pin 24 extends along a central axis of the shielding barrel 22 to a plane that the end surface 26 is in.

The RF PCB 10 includes a first surface 10a and a second surface 10b opposite to the first surface 10a. The RF PCB 10 also includes an RF circuit 11, an antenna 12, a socket 13, a test node 14, and a ground node 15. The RF circuit 11, the antenna 12, and the socket 13 are arranged on the first surface 10a. The RF circuit 11 includes an output node 11a and is configured to generate high frequency signals and output the high frequency signals through the output node 11a. The antenna 12 is configured to emit the high frequency signals and is detachably connected to the output node 11a via the socket 13. The test node 14 and the ground node 15 are arranged on the second surface 10b. The test node 14 is connected to the output node 11a and is configured for contacting the probe pin 24. The ground node 15 is annular and corresponds to the end surface 26. The inner diameter of the ground node 15 is less than that of the end surface 26, while the outer diameter of the ground node 15 is greater than that of the end surface 26. The ground node 15 is connected to the ground wire of the RF circuit 11 and surrounds the test node 14, centering on the test node 14.

During measurement of the EMC, the antenna 12 is removed from the socket 13 to avoid emitting the high frequency signals. The probe 20 is then connected to the RF PCB 10 such that the probe pin 24 contacts the test node 14 and the end surface 26 contacts the ground node 15. Thus, the shielding barrel 22 cooperates with the RF PCB 10 to provide an EMC shield for the probe pin 24. As such, the shielding barrel can be conveniently grounded.

Figure 3:
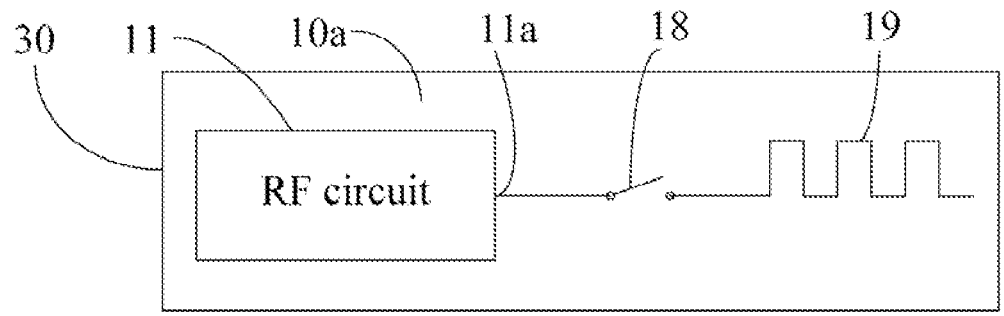
FIG. 3 is a schematic view of an RF PCB, in accordance with another embodiment.
Figure 4:
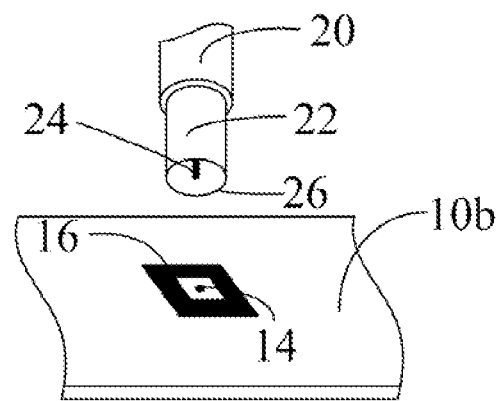
FIG. 4 is a partial view of a probe of an EMC measuring device and the RF PCB of FIG. 3, which is viewed at another angle.

Referring to FIGS. 3 and 4, an RF PCB 30, according to another embodiment, is shown. Comparing to the above mentioned embodiment in FIGS. 1-2, the differences are: the antenna 19 is formed on the RF PCB 10 directly; the antenna is connected to the output node 11a through a switch 18; and the ground node 16 is shaped as a rectangular frame. In measurement, the antenna 19 is removed by turn off the switch 18. The ground node 16 can also contact the end surface 26 while the probe pin 24 contacts the test node 14.

It should be understood that, the shape of the ground node is not limited to the present embodiments as long as it can contact the end surface 26 while the probe pin 24 contacting the test node 14. In alternative embodiments, the test node 14 and the ground node 15 can be arranged on the first surface 10a.

It will be understood that the above particular embodiments is shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A radio frequency (RF) printed circuit board (PCB) comprising a RF circuit for generating high frequency signals; the RF PCB adaptable to be connected to a probe of an electromagnetic compatibility (EMC) measuring device when measuring the EMC of the RF PCB, the probe comprising a probe pin and a shielding barrel surrounding the probe pin, the shielding barrel comprising an end surface at a distal end of the shielding barrel, the probe pin extending to a plane that the end surface is in; the RF PCB further comprising:

a test node connected to the RF circuit, the test node being configured to contact the probe pin and output the high frequency signals when EMC of the RF PCB is measured;

a ground node surrounding the test node, the ground node corresponding to the end surface and configured to contact the end surface while the probe pin contacts the test node.

2. The RF PCB of claim 1, wherein the RF circuit comprises an output node to output the high frequency signals; the RF PCB further comprises a first surface and a second surface opposite to the first surface, and the output node is arranged on the first surface, the test node and the ground node are arranged on the second surface.

3. The RF PCB of claim 1, wherein the ground node is annular.

4. The RF PCB of claim 3, wherein an inner diameter of the ground node is less than that of the end surface, and an outer diameter of the ground node is greater than that of the end surface.

5. The RF PCB of claim 3, wherein the ground node centers on a testing port.

6. The RF PCB of claim 1 further comprising an antenna and a socket, wherein the antenna is configured to emit the high frequency signals and detachably connected to the RF circuit through the socket.

7. The RF PCB of claim 1 further comprising an antenna and a switch, wherein the antenna is configured to emit the high frequency signals and connected to the RF circuit through the switch.

* * * * *